(12) United States Patent
Cho et al.

(10) Patent No.: US 6,441,768 B2
(45) Date of Patent: Aug. 27, 2002

(54) HIGH SPEED ENCODER AND METHOD THEREOF

(75) Inventors: Gea-ok Cho, Suwon; Min-kyu Song; You-sam Na, both of Seoul, all of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/731,881

(22) Filed: Dec. 8, 2000

(30) Foreign Application Priority Data

Dec. 8, 1999 (KR) .............................. 99-55833

(51) Int. Cl.[7] .............................. H03M 1/36; H03M 7/04
(52) U.S. Cl. ........................................ 341/160; 341/155
(58) Field of Search .............................. 341/96, 97, 98, 341/94, 160

(56) References Cited

U.S. PATENT DOCUMENTS 4,586,025 A * 4/1986 Knierim ..................... 341/160
5,155,489 A * 10/1992 Gulczynski ................. 341/160
5,243,348 A * 9/1993 Jackson ...................... 341/160
5,252,974 A * 10/1993 Gulczynski ................. 341/155
5,382,955 A * 1/1995 Knierim ..................... 341/160

* cited by examiner

*Primary Examiner*—Howard L. Williams
(74) *Attorney, Agent, or Firm*—Sughrue Mion, PLLC

(57) ABSTRACT

A high-speed and low-power encoder and an encoding method, wherein the encoder includes a switching unit for receiving a thermal code of a predetermined number of bits received in series, and outputting one bit among the received bits as a most significant bit and the other bits in parallel, and an encoder for dividing the bits received from the switching unit in parallel into groups having a predetermined number of bits, encoding the bits in each group into a predetermined number of bits, selecting one group of encoded bits using bits not used by the groups, and outputting least significant bits together with the most significant bit output from the switching unit.

6 Claims, 5 Drawing Sheets

HIGH SPEED ENCODER AND METHOD THEREOF

BACKGROUND OF THE INVENTION

1. Field of the Invention

The present invention relates to an encoder, and more particularly, to an encoder which operates at high speed and uses a small amount of power, and an encoding method using the same.

2. Description of the Related Art

In conventional flash-type analog-to-digital converters (hereinafter, referred to as ADCs), the outputs of comparators form a thermal code. Here, an encoder converts the thermal code into a binary code or a binary-coded-decimal (BCD) code to perform further processing on the thermal code. The encoder must operate at high speed and provide a high resolution in communications systems where an analog video signal or an analog audio signal is converted into a digital signal. Existing types of encoders include a priority encoder and a memory cell encoder.

FIG. 1 is a block diagram of a conventional priority encoder. The priority encoder of FIG. 1 converts 16-bits produced from an analog signal into 4 bits, which correspond to least significant bits (LSBs), and 2 bits, which correspond to most significant bits (MSBs).

Referring to FIG. 1, a code generator 110 converts an analog signal of 64 levels into a digital signal of 16 bits (b0–b15). An LSB encoder 100 is made up of first, second, third, fourth and fifth encoders 111,112,113,114 and 115 and first and second selectors 116 and 117. That is, the first, second, third and fourth encoders 111,112,113 and 114 receive b0 through b3, b4 through b7, b8 through b11 and b12 through b15, respectively, and encode the received four bits into 3-bits. The fifth encoder 115 receives four bits, one from each of the first, second, third and fourth encoders 111,112,113 and 114, and encodes the four bits into two LSBs b2 and b3. Further, each of the first and second selectors 116 and 117 encodes 4 bits, which are output from each of the first, second, third and fourth encoders 111, 112, 113 and 114, into bits b1 and b0, respectively.

An MSB encoder 122 encodes four MSBs B0 through B3 into two MSBs B0 and B1. A corrector 120 corrects six received bits b0 through b3 and B0 and B1.

The priority encoder as shown in FIG. 1 performs all operations using a signal output from an ADC, so that a large capacity buffer is needed, and the critical path becomes long. The large-capacity buffer and the long critical path of the priority encoder of FIG. 1 cause high power consumption and a long delay in the processing of digital signals. Also, the priority encoder as shown in FIG. 1 includes selectors 116 and 117 and has a complicated circuit structure, so that it is disadvantageous in terms of speed and power.

Memory cell type encoders are also enlarged with an increase in the number of input bits, and a complicated data path causes delay and noise.

SUMMARY OF THE INVENTION

An objective of the present invention is to provide a high-speed encoder in which the current consumption and delay time are reduced by shortening a data path without increasing the area of use.

Another objective of the present invention is to provide an encoding method for reducing current consumption and delay time by shortening a data path without increasing the area of use.

To achieve the first objective, the present invention provides a high-speed encoder including: a switching unit for receiving a thermal code of a predetermined number of bits received in series, and outputting one bit among the received bits as a most significant bit and the other bits in parallel; and an encoder for dividing the bits received from the switching unit in parallel into groups having a predetermined number of bits, encoding the bits in each group into a predetermined number of bits, selecting one group of encoded bits using bits not used by the groups, and outputting least significant bits together with the most significant bit output from the switching unit. The encoder includes: a block unit for dividing the received bits into blocks having a predetermined number of bits and encoding the signals in each group into a predetermined number of bits; a selection unit for selecting the encoded bits in one among the blocks by combining bits not used by the blocks among the received bits; and a bit generation unit for generating bits other than the encoded bits selected by the selection unit and the bit generated by the switching unit, by combining the unused bits.

To achieve the second objective, the present invention provides a method of encoding a thermal code output from an analog-to-digital converter, the method including: dividing received bits into blocks having a predetermined number of bits and encoding the bits in each group into a predetermined number of bits; selecting one among the blocks by combining bits not used by the blocks among the received bits, and generating the encoded bits in the selected block; and generating bits other than the encoded bits generated in the previous step, by combining the unused bits.

BRIEF DESCRIPTION OF THE DRAWINGS

The above objectives and advantage of the present invention will become more apparent by describing in detail a preferred embodiment thereof with reference to the attached drawings in which.

DESCRIPTION OF THE PREFERRED EMBODIMENT

Figure 1:
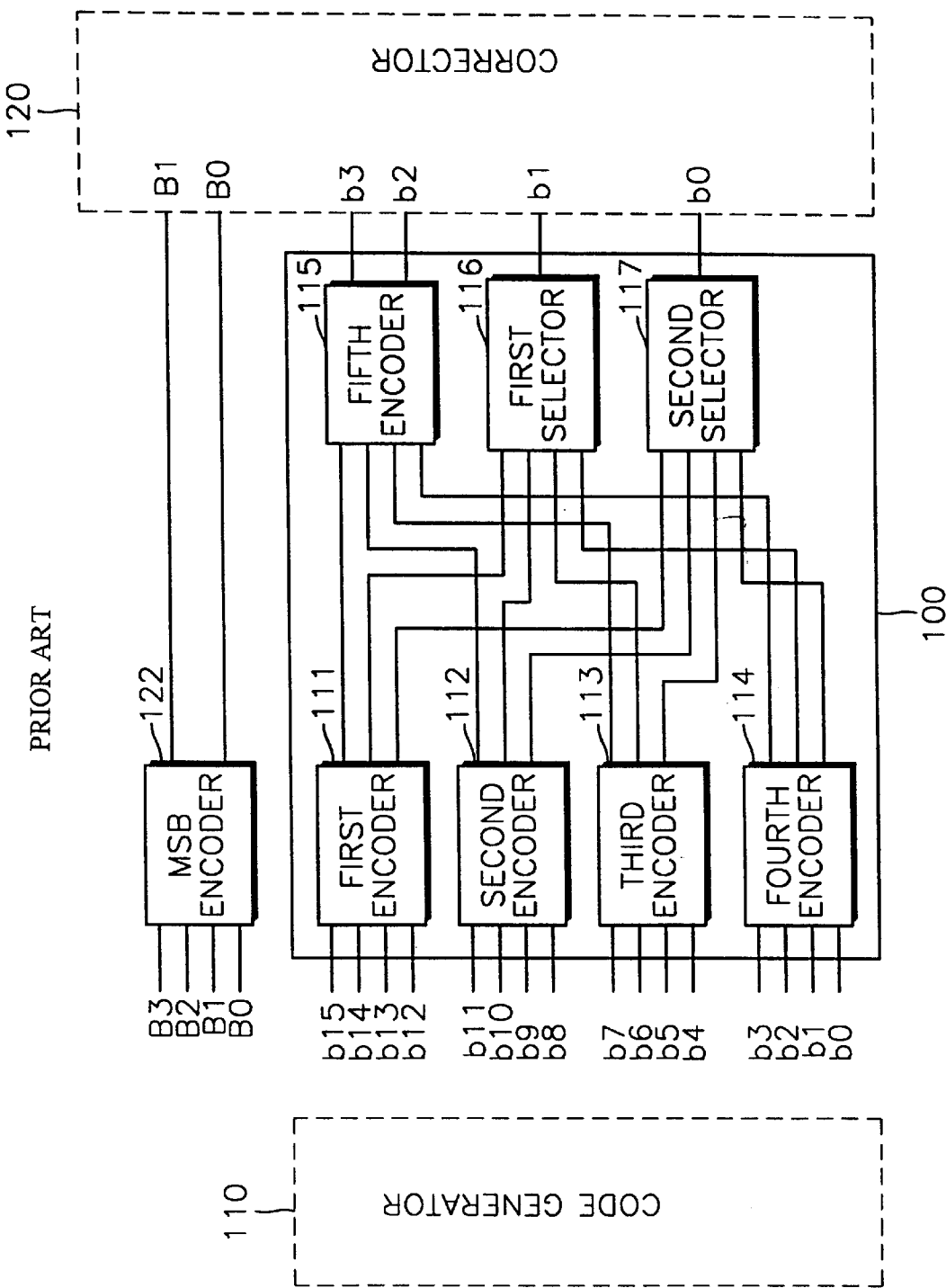
FIG. 1 is a block diagram of a typical priority encoder.
Figure 2:
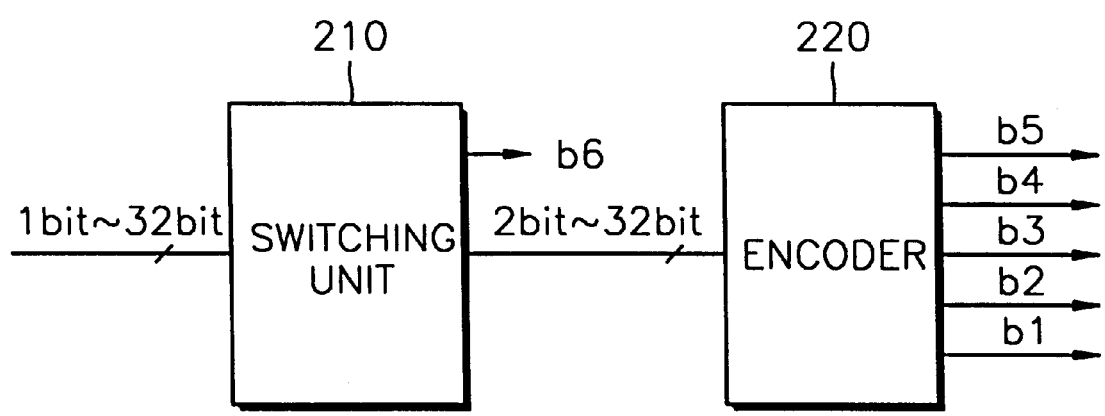
FIG. 2 is a block diagram of a high-speed encoder according to the present invention.

Referring to FIG. 2, a high-speed encoder according to the present invention includes a switching unit 210 and an encoder 220. The switching unit 210 receives a thermal code consisting of a total of 32 bits received in series, and outputs bit 1 as an MSB b6 and the remaining bits, bit 2 through bit 32, in parallel. The encoder 220 generates bits b1 through b5, which are least significant bits (LSBs), using bit 2 through bit 32 output from the switching unit 210.

Figure 3:
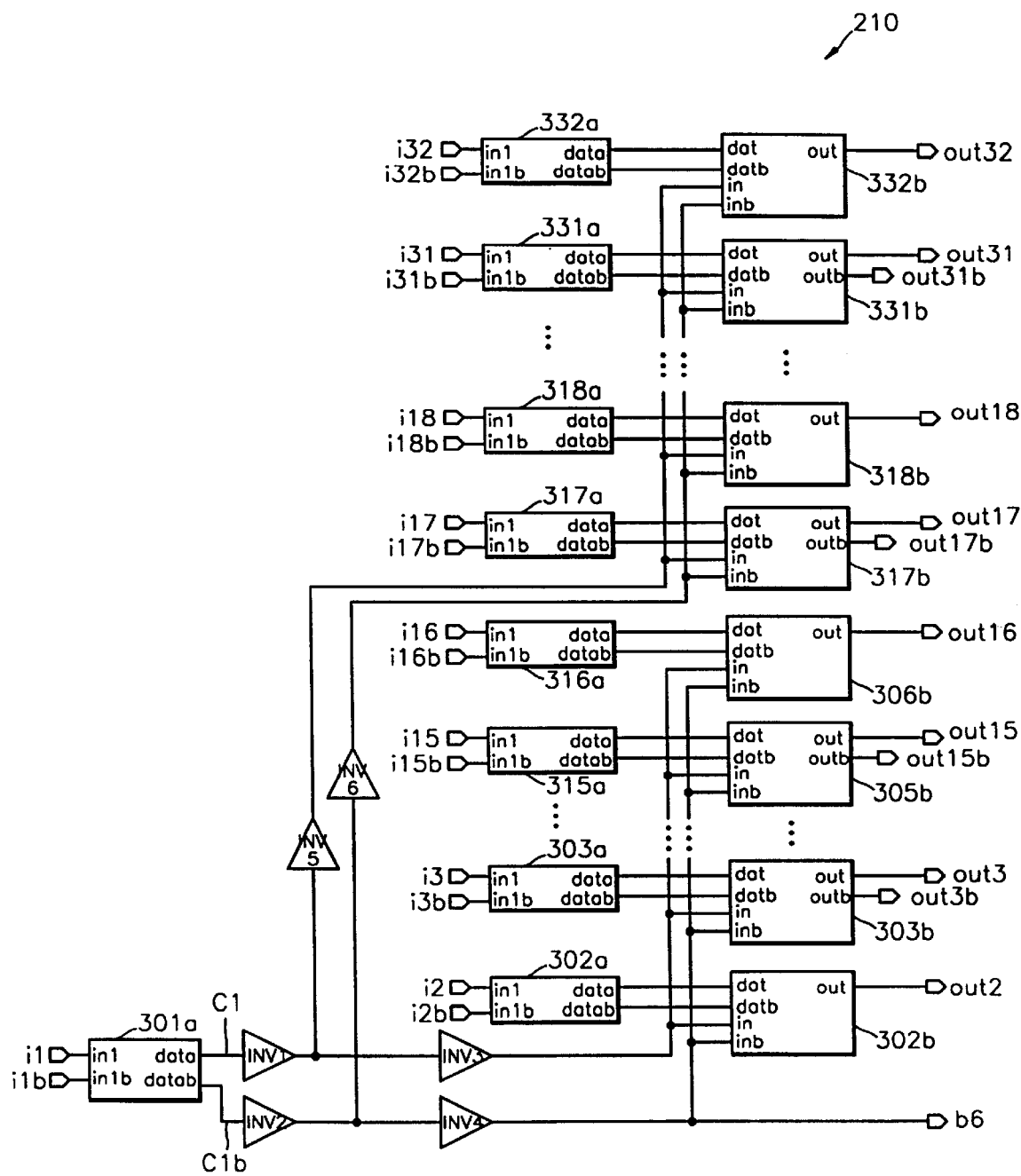
FIG. 3 is a detailed block diagram of the switching unit of FIG. 2.

Referring to FIG. 3, the switching unit 210 of FIG. 2 is made up of 32 latches 301a through 332a, 31 multiplexers 302b through 332b, and 6 inverters INV1 through INV6.

The latches 301a through 332a receive bits i1 through i32 and complementary bits i1b through i32b via two input ports in1 and in1b, respectively, latch the bits i1 through i32 and the complementary bits i1b through i32b, and output the results of the latching via two output ports data and datab.

The multiplexers 302b and 332b receive control signals c1 and c1b via input ports in and inb, respectively, from the two output ports data and datab of the first latch 301a, receive signals via input ports dat and datb from the output ports data and datab of the latches 302a through 332a in response to the control signals c1 and c1b, and output MUXed data out2 through out32, respectively.

Referring to FIG. 3, first, the first latch 301a receives a first bit signal i1, and generates the two control signals c1 and c1b for controlling the multiplexers 302b through 332b and a MSB bit b6. The other latches 302a through 332a latch the received bits i2 through i32, respectively, and particularly convert a zero return signal into a non-zero return signal in order to save the power for bit switching.

The multiplexers 302b through 332b output 32 bits in response to the control signals c1 and c1b generated by the first latch 301a. That is, when the bit i1 received by the first latch 301a is high, the multiplexers 302b through 332b output the signals i2 through i32 received by the latches 302a through 332a without change. Also, when the bit i1 received by the first latch 301a is low, the multiplexers 302b through 332b output the complementary signals i2b through i32b received by the latches 302a through 332a. The inverters INV1 through INV6 buffer the control signals c1 and c1b to be applied to the selection ports in and inb of the multiplexers 302b through 332b.

Figure 4:
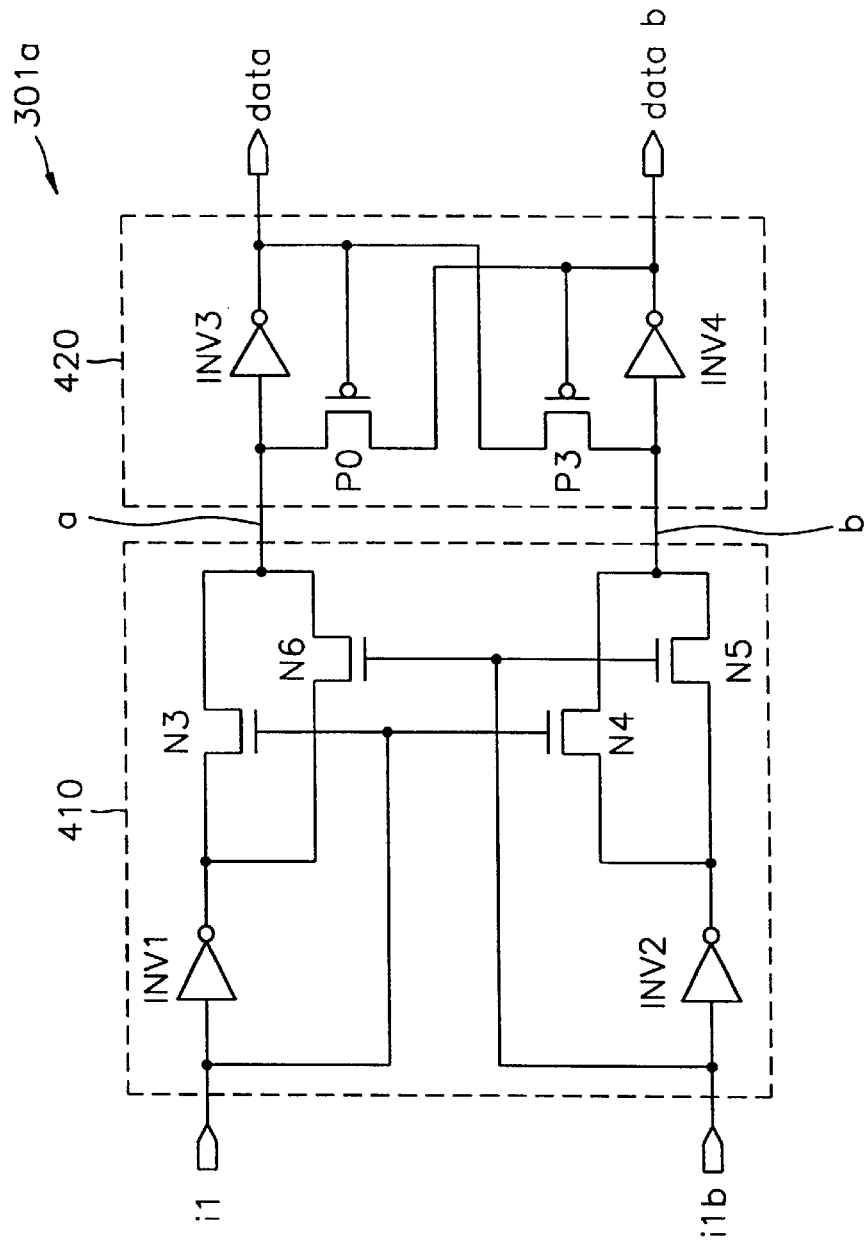
FIG. 4 is a detailed circuit diagram of the latch of FIG. 3.

FIG. 4 is a detailed circuit diagram of the first latch 301a of FIG. 3. Referring to FIG. 4, the first latch 301a includes an input unit 410 and an output unit 420. The input unit 410 is made up of N-channel MOS transistors N3, N4, N5 and N6. The N-channel MOS transistor N3 transfers the output signal of the first inverter INV1 to a node a in response to the input bit i1 of the input port 410. The N-channel MOS transistor N4 transfers the output signal of the second inverter INV2 to a node b in response to the input bit i1 of the input port 410. The N-channel MOS transistor N5 transfers the output signal of the second inverter INV2 to a node b in response to the input bit i1b of the input port 410. The N-channel MOS transistor N6 transfers the output signal of the first inverter INV1 to a node a in response to the input bit i1b of the input port 410. The output unit 420 is made up of P channel MOS transistors P0 and P3 and third and fourth inverters INV3 and INV4.

One end of the P channel MOS transistor P0 is connected to the node a, the other end is connected to the output port datab, and the gate is connected to the output port data. One end of the P channel MOS transistor P3 is connected to the node b, the other end is connected to the output port data, and the gate is connected to the output port datab. The third inverter INV3 is connected between the node a and the output port data, and the fourth inverter INV4 is connected between the node b and the output port datab.

Referring to FIG. 4, the output unit 420 outputs data for controlling the multiplexers 302b through 332b. That is, when the first bit i1 received by the output unit 420 is in a high state, the signals i2 through i32 are output without change, and when the first bit i1 received by the output unit 420 is in a low state, the complementary signals i2b through i32b are output.

Figure 5:
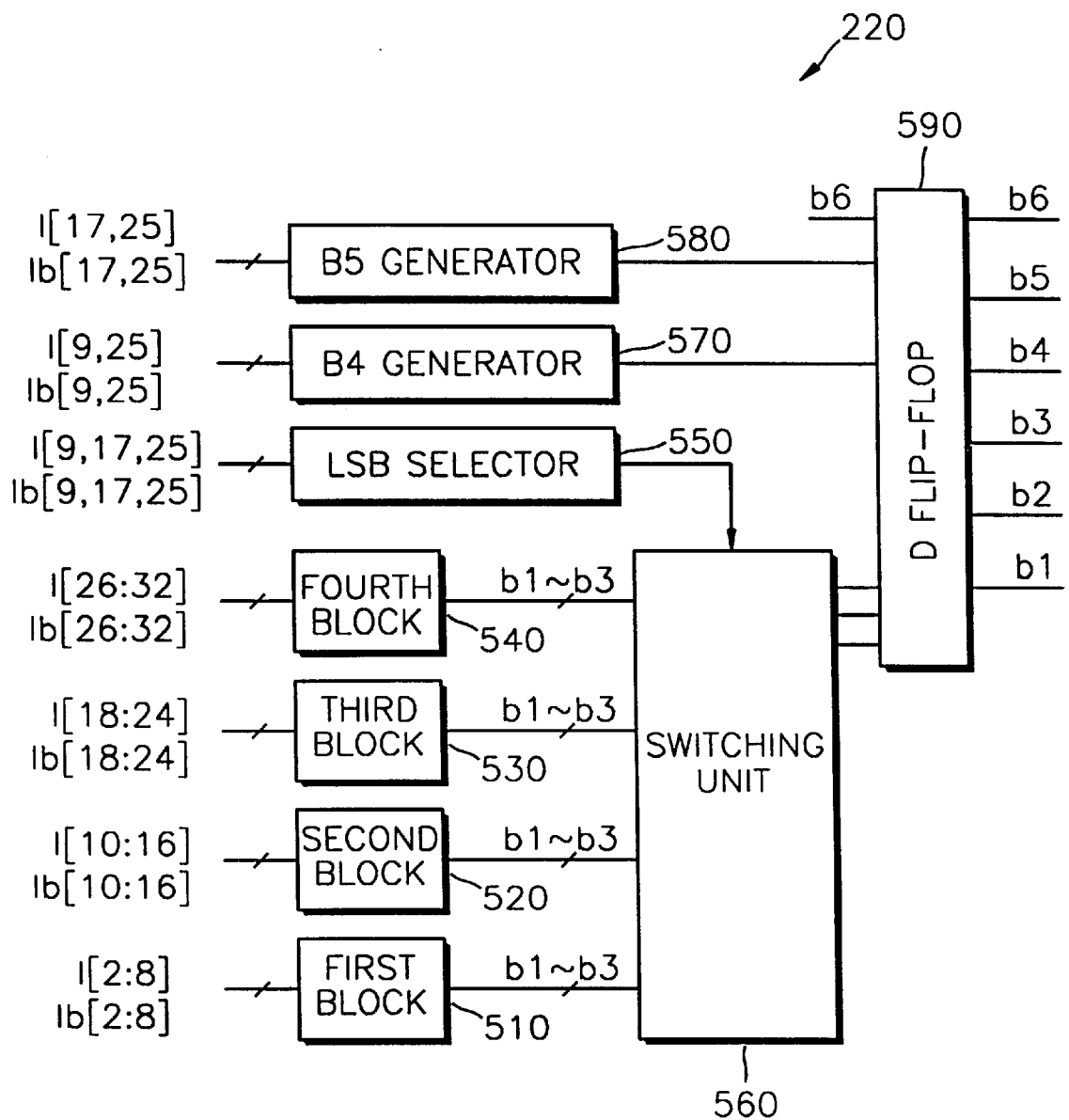
FIG. 5 is a detailed block diagram of the encoder of FIG. 2.

FIG. 5 is a detailed block diagram of the encoder 220 of FIG. 2. Referring to FIG. 5, the encoder 220 includes first, second, third and fourth blocks 510, 520, 530 and 540, each for blocking a predetermined number of the input signals i2 through i32 and ib2 through ib32, an LSB selector 550 for selecting one among the first, second, third and fourth blocks 510, 520, 530 and 540, a switching unit 560 for outputting the outputs of one among the first, second, third and fourth blocks 510, 520, 530 and 540 in response to a control signal output from the LSB selector 550, a B4 generator 570 for generating a bit b4, a B5 generator 580 for generating a bit b5, and a D flip flop 590 for latching bits b1–b6 output from the switching unit 560, the B4 generator 570, the B5 generator 580 and the switching unit 210.

The first, second, third and fourth blocks 510, 520, 530 and 540 receive bit 2 through bit 8 (i2 through i8), bit 10 through bit 16 (i10 through i16), bit 18 through bit 24 (i18 through i24), and bit 26 through bit 32 (i26 through i32), respectively, and each encode the received bits into 3 bits b1 through b3.

The switching unit 560 transfers three bits selected from the outputs of the first through fourth blocks 510 through 540 to the D flip flop 590 in response to the control signal of the LSB selector 550.

The LSB selector 550 generates the control signal for selecting one among the first, second, third and fourth blocks 510, 520, 530 and 540 using input signals i9, i17 and i25 not used by the first through fourth blocks 510 through 540 among the input signals i2 through i32.

The B4 generator 570 generates a bit b4 using the input signals i9 and i25 not used by the first through fourth blocks 510 through 540 among the input signals i2 through i32.

The B5 generator 580 generates a bit b5 using the input signals i17 and i25 not used by the first through fourth blocks 510 through 540 among the input signals i2 through i32.

Here, the first through fourth blocks 510 through 540 require the time taken for data to undergo 3 multiplexers, and the LSB selector 550 requires only about the time taken for data to undergo 2 multiplexers. Thus, little delay occurs.

The D flip flop 590 latches bits b4 and b5 output from the B4 generator 570 and the B5 generator 580, bits b1 through b3 output from the switching unit 560, and a bit b6 output from the switching unit 210.

As described above, the high-speed encoder according to the present invention can reduce current consumption and delay time by shortening a data path without increasing the area occupied by the high-speed encoder within a chip. Also, power consumption due to clock switching is reduced by converting a zero return signal into a non-zero return signal using latches.

What is claimed is:

1. A high-speed encoder comprising:
   a switching unit for receiving a thermal code of a first predetermined number of bits in series, and outputting a first one of the received bits as a most significant bit and the other received bits in parallel; and
   an encoder for dividing the other received bits output in parallel from the switching unit into a plurality of groups each having a second predetermined number of bits, encoding the bits in each of the plurality of groups into a third predetermined number of bits, selecting the encoded bits of one of the groups based on bits among the other received bits not included the groups, and outputting least significant bits together with the most significant bit output from the switching unit.

2. The high-speed encoder of claim 1, wherein the switching unit comprises:
   a plurality of latches for converting a zero return signal of a received thermal code into a non-zero return signal; and
   a plurality of multiplexers for selectively transmitting signals converted by the latches to the encoder.

3. The high-speed encoder of claim 2, wherein when an input bit received by the first latch is high, the remaining latches output the received signals, and when the input bit received by the first latch is low, the remaining latches output phase-inverted received signals.

4. The high-speed encoder of claim 2, wherein each of the latches comprises:

- a first N-channel MOS transistor for transferring an output signal of a first inverter to a first node in response to an input bit;
- a second N-channel MOS transistor for transferring an output signal of a second inverter to a second node in response to the input bit;
- a third N-channel MOS transistor for transferring the output signal of the second inverter to the second node in response to a complementary input bit;
- a fourth N-channel MOS transistor for transferring the output signal of the first inverter to the first node in response to the complementary input bit;
- a first P channel MOS transistor having a first terminal which is connected to the first node, a second terminal which is connected to a first output port, and a gate which is connected to a second output port;
- a second P channel MOS transistor, one end of which is connected to the second node, the other end of which is connected to the first output port, and the gate of which is connected to the second output port;
- a third inverter connected between the first node and the first output port; and
- a fourth inverter connected between the second node and the second output port.

5. The high-speed encoder of claim 1, wherein the encoding unit comprises:

- a block unit for dividing the other received bits into the plurality of groups each having the second predetermined number of bits and encoding the bits in each of the plurality of groups into the third predetermined number of bits;
- a selection unit for selecting the encoded bits of one of the groups by combining the bits not included in the groups among the other received bits; and
- a bit generation unit for generating bits other than the encoded bits selected by the selection unit and the first one of the received bits output by the switching unit, by combining the bits not included in the groups.

6. A method of encoding a thermal code output from an analog-to-digital converter, the method comprising:

- receiving a first predetermined number of bits and outputting a first one of the received bits as a most significant bit;
- dividing the received bits other than the first one of the received bits into a plurality of groups each having a second predetermined number of the received bits other than the first one of the received bits and encoding the bits in each of the groups into a third predetermined number of bits;
- selecting one of the groups based on bits among the received bits other than the first one of the received bits which are not included in the groups, and outputting the encoded bits of the selected group; and
- generating bits other than the encoded bits of the selected group, by combining the received bits other than the first one of the received bits which are not included in the groups, and outputting the generated bits.

* * * * *